United States Patent

Anthony et al.

[11] Patent Number: 5,439,492
[45] Date of Patent: Aug. 8, 1995

[54] FINE GRAIN DIAMOND WORKPIECES

[75] Inventors: Thomas R. Anthony, Schenectady; James F. Fleischer, Scotia, both of N.Y.

[73] Assignee: General Electric Company, Worthington, Ohio

[21] Appl. No.: 967,461

[22] Filed: Oct. 28, 1992

Related U.S. Application Data

[63] Continuation-in-part of Ser. No. 897,124, Jun. 11, 1992, abandoned.

[51] Int. Cl.$^6$ .................................... B24D 11/00
[52] U.S. Cl. ................................. 51/295; 51/307; 239/DIG. 19
[58] Field of Search ............... 51/307, 309, 295; 239/596, DIG. 19, 591, 600, 601

[56] References Cited

U.S. PATENT DOCUMENTS

| | | | |
|---|---|---|---|
| 3,756,106 | 9/1973 | Chadwick et al. | 83/177 |
| 3,997,111 | 12/1976 | Thomas et al. | 239/596 |
| 4,131,236 | 12/1978 | Saunders | 239/596 |
| 4,150,794 | 4/1979 | Higgins | 239/596 |
| 4,253,611 | 3/1981 | Hart | 239/DIG. 19 |
| 4,486,286 | 12/1984 | Lewin et al. | 204/192 C |
| 4,504,519 | 3/1985 | Zelez | 427/39 |
| 4,645,977 | 2/1987 | Kurokawa et al. | 315/111.21 |
| 4,707,384 | 11/1987 | Schachner et al. | 427/249 |
| 4,976,324 | 12/1990 | Tibbetts | 175/329 |
| 5,030,276 | 6/1991 | Sung et al. | 51/307 |
| 5,033,681 | 7/1991 | Munoz | 239/DIG. 19 |

OTHER PUBLICATIONS

K. Maruyama et al., *Synthesis of Hexagonal Diamond in a Hydrogen Plasma Jet*, Journal of Materials Science Letters 11 1992 (no month), pp. 116–118.

*Primary Examiner*—Deborah Jones

[57] ABSTRACT

Diamond workpieces comprised of polycrystalline CVD diamond having a grain size of less than 1 μm are provided. These diamond workpieces are more resistant to wear and are more conducive to polishing than conventional diamond workpieces having large-grain diamonds. Three-dimensional workpieces such as water jet nozzles and water jet mixing tubes comprised of the small-grain diamonds provide particular advantage in that they can be easily finished to a final size and shape.

4 Claims, 5 Drawing Sheets

FINE GRAIN DIAMOND WORKPIECES

CROSS-REFERENCE TO RELATED APPLICATIONS

This application is a continuation-in-part of application Ser. No. 07/897,124, filed Jun. 11, 1992 now abandoned, entitled "SMOOTH SURFACE CVD DIAMOND FILMS AND METHOD FOR PRODUCING SAME", assigned to the same assignee as the present invention.

BACKGROUND OF THE INVENTION

The present invention relates to diamond workpieces and, more particularly, to their fabrication based on chemical vapor deposition technology. The diamond form of carbon possesses many desirable physical properties such as hardness, chemical inertness, infrared transparency, and excellent heat conductivity coupled with very high electrical resistivity. Its hardness and thermal properties are but two of the characteristics that make diamond useful in a variety of industrial components such as high velocity water jet nozzles, high velocity air/abrasive nozzles, and high velocity mixing tubes. Although the ability to synthesize diamond by high pressure/high temperature (HP/HT) techniques has been known for some time, the requirement of high pressure and high temperature has been a limitation, for example, in product configuration. Diamond workpieces with a complex three-dimensional configuration cannot be obtained by such processes without significant finishing or machining.

Efforts to produce diamond workpieces with a configuration which varies in three dimensions have been directed toward the growth of diamond at low pressures, where it is metastable. For example, to form three-dimensional diamond workpieces such as water jet nozzles, air/abrasive nozzles, and mixing tubes, a tube or wire is typically used as a growth substrate, and diamond growth on these substrates occurs on more than one plane. The substrate may be etched away to obtain a self-supporting article.

A number of methods are known for growing diamond coatings. One such method is disclosed in U.S. Pat. No. 4,707,384. Another method is disclosed by E. V. Spitsyn et al., "Vapor Growth of Diamond on Diamond and Other Surfaces," *Journal of Crystal Growth* 52, 219–226 (1981). Additional methods are disclosed in U.S. Pat. Nos. 4,486,286; 4,504,519; 4,645,977; and 4,707,384.

One of these techniques involves the use of a dilute mixture of hydrocarbon gas (typically methane) and hydrogen, wherein the hydrocarbon content usually is varied from about 0.1% to about 2.5% of the total volumetric flow. The gas is introduced via a quartz tube located just below a hot tungsten filament which is electrically heated to a temperature ranging from between about 1750°–2400° C. The gas mixture dissociates at the filament surface, and diamonds are condensed onto a heated substrate placed just below the hot tungsten filament. The substrate is heated to a temperature of about 500°–1100° C.

A second technique involves the imposition of a positive discharge to the foregoing filament process. The discharge serves to increase the nucleation density and growth rate and is believed to enhance formation of diamond in the form of a film, as opposed to discrete diamond particles. Of the plasma systems that have been utilized in this area, there are three basic systems: microwave plasma, RF (inductively or capacitively coupled) plasma, and DC plasma. The microwave and RF plasma systems utilize relatively complex and expensive equipment which usually requires complex tuning or matching networks to electrically couple electrical energy to the generated plasma. Additionally, the diamond growth rate offered by these two systems can be quite modest.

In general, processes for the chemical vapor deposition of diamond involves the selection of operating parameters such as the selection of a precursor gas and diluent gases, the mixture proportions of the gases, pressure and temperature of the gases, substrate temperature, and means of gas activation. These parameters are adjusted to provide diamond nucleation growth on the substrate. Mixture proportions and conditions must provide atomic hydrogen to stabilize the surface of the diamond film and preferably minimize the deposition of graphite. Codeposition of graphite is more evident if the hydrocarbon (methane) concentration is increased to above 3%.

Known CVD techniques provide diamond workpieces with a rough, chaotic surface typical of polynucleated crystalline material and exhibit a Raman line at 1332 $cm^{-1}$. However, diamond workpieces such as high velocity water jet nozzles and high velocity air/abrasive nozzles require minimum surface defects and deviations in configuration to avoid breaking up the water/air jet. The nozzle used in a water jet is a free jet nozzle. Once the water stream leaves the top inner diameter edge of the nozzle, it does not contact the rest of the inner diameter of the nozzle because of the inward radial momentum of the water caused by the inward flow of water toward the nozzle in the reservoir. Consequently, the only critical part of the inner diameter is the corner edge at the top of the nozzle. This edge must have a radius of curvature of 1–3 $\mu m$, and its included angle must be within 3° of a 90° angle. In addition, the nozzle aperture on this top edge must not be out of round by more than 0.2%. All of these specifications are necessary to produce a symmetric, stable jet stream which can travel 6" before Rayleigh instability breaks up the jet. Although smooth surfaces can be obtained for diamond workpieces which are grown on highly polished substrates, post-deposit abrasive polishing is often still required to provide a suitable component. Because the hardness of diamond varies by an order of magnitude with the crystallographic direction, it is difficult to polish polycrystalline diamond with a large grain size to the mirror-like finish demanded by the water jet nozzle application. Grains with a polishing-resistant orientation will stand above the surface, while grains with a soft orientation lie below the average surface level of the polish. This variability in polishing makes it very difficult to produce sharp inner diameter edges on the water jets with the specifications mentioned above. In addition, polishing large-grain diamond samples results in pull-out of the grains from the sample, which makes it more difficult to produce the sharp inner diameter edge required.

Workpieces produced by conventional CVD processes provide diamond deposits with ingrown stresses, which cause cracks and grain pull-out. Conventional diamond mixing tubes have failed because of circumferential and axial cracks generated by stress produced during the deposition process in the diamond walls of the mixing tube. When $Al_2O_3$ is used as an abrasive, sections of the funnel and mixing tube walls, defined by these ingrown cracks, flake off and cause the abrasive jet to deviate from the straight line path through the mixing tube. The deflection of the jet can cause a catastrophic failure of the mixing tube. To counteract these problems, a metal shield is often placed around the diamond mixing tubes to impart compressive stress to take advantage of the greater mechanical strength of diamond in compression, as compared to tension. This has not proven to be a satisfactory solution. Therefore, it is desirable to provide diamond workpieces with limited ingrown stresses so as to provide greater mechanical strength and greater resistance to particle pull-out when polished.

SUMMARY OF THE INVENTION

This invention relates to a polycrystalline CVD diamond workpiece having a configuration which varies in three dimensions, wherein the average grain size of the CVD diamond is less than 1 $\mu$m.

It is an object of the present invention to provide diamond workpieces resistant to cracking from ingrown stresses and resistant to grain pull-out to extend their useful life.

It is a further object of the present invention to provide diamond workpieces which can be polished smoothly without pull-out of individual grains.

Upon further study of the specification and appended claims, further objects and advantages of this invention will become apparent to those skilled in the art.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views and wherein.

DETAILED DESCRIPTION

Figure 1:
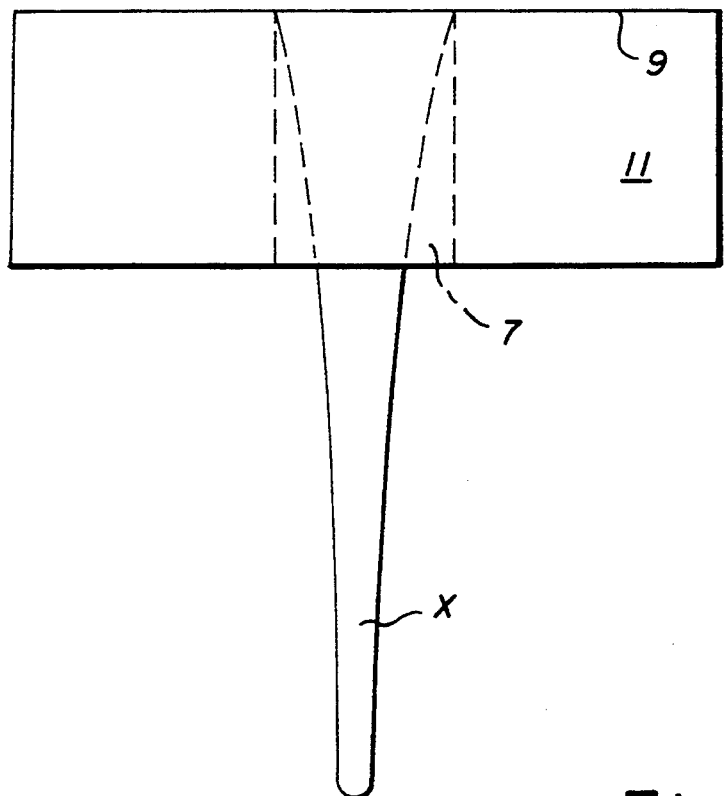
FIGS. 1 and 2 are schematic diagrams of a high pressure water jet nozzle within the scope of this invention.

In contrast to the growth surface of conventionally produced CVD diamond, which is rough, angular, and faceted, the growth surface of the diamond workpieces of the present invention is much smoother, with at most gentle tumultus rises in the plane thereof. Whereas the grain or crystal size on the growth surface of a normal CVD film is about 10–150 $\mu$m, more typically 100–150 $\mu$m, the diamond films of this invention have a grain (crystal) size both on the growth surface and internally of less than 1 $\mu$m. The reason for this difference in the grain size on the surface of a conventionally grown CVD diamond film is that once the diamond starts growing on and covers the substrate surface, nucleation of new diamond grains cease. At this point, only the old diamond grains that were previously nucleated continue to grow. The increasing surface grain size and increasing film thickness is the result of competitive growth due to competing crystals. Thus, whereas the grain size on the substrate surface initially is approximately 1 $\mu$m, as the film grows thicker, certain favorably oriented grains grow faster than their neighbors and overgrow them. Fewer and fewer grains survive as the films become thicker, with the resultant surviving grains becoming larger since they growth both laterally and vertically.

In producing the diamond workpieces of this invention, an increasing grain size with an increasing diamond film thickness does not occur. Instead, there appears to be a continuous nucleation of new diamond grains that cover up the old diamond grains so that no grain has a chance to increase in size. Thus, the grain size is independent and constant throughout the thickness of the resulting diamond workpiece.

The growth surface of the diamond workpieces of this invention is smooth, i.e., its surface varies, except for an occasional individual diamond grain embedded in the surface, with variations in height less than 2% and preferably less than 1%. Grains vary in size less than 30% and usually less than 10% from the average size of the diamond grains forming the diamond workpiece, which grains average less than 1 $\mu$m, i.e., they average from about 0.05–0.7 $\mu$m, and, in the preferred embodiments, about 0.1–0.3 $\mu$m.

The substrate side of the diamond workpiece will be a mirror image of the surface of the substrate on which it is grown which, in the case of water jet components of this invention, is also smooth, i.e., it varies less than 1%, preferably less than 0.1%, in thickness before polishing. When polished to a mirror surface, it lacks the voids and irregularities resulting from crystal pull-out. Because of the smallness and uniformity of the grains, a surface thereof can be easily polished to a mirror-smooth finish without flaws therein. The smaller grains embedded within the surface of the film resist being dislodged therefrom during the polishing process. Thus, the grain (facet) size of the novel diamond films of this invention is remarkably uniform throughout and typically is less than 1 $\mu$m. The grain size is so small because the initially deposited grains do not act as growth surfaces for the diamond carbon subsequently deposited thereon. Instead, the formation of each new grain is substantially unaffected by the size of the prior deposited grain so that a homogeneous diamond workpiece is produced, irrespective of the thickness of the diamond coating which provides such workpiece. As a result, the smooth fine-grain diamond workpieces do not have Raman signature at 1332 $cm^{-1}$. Raman spectra also show that the nitrogen does not cause a noticeable increase in graphite codeposition or $SP^2$ bonding.

Figure 5:
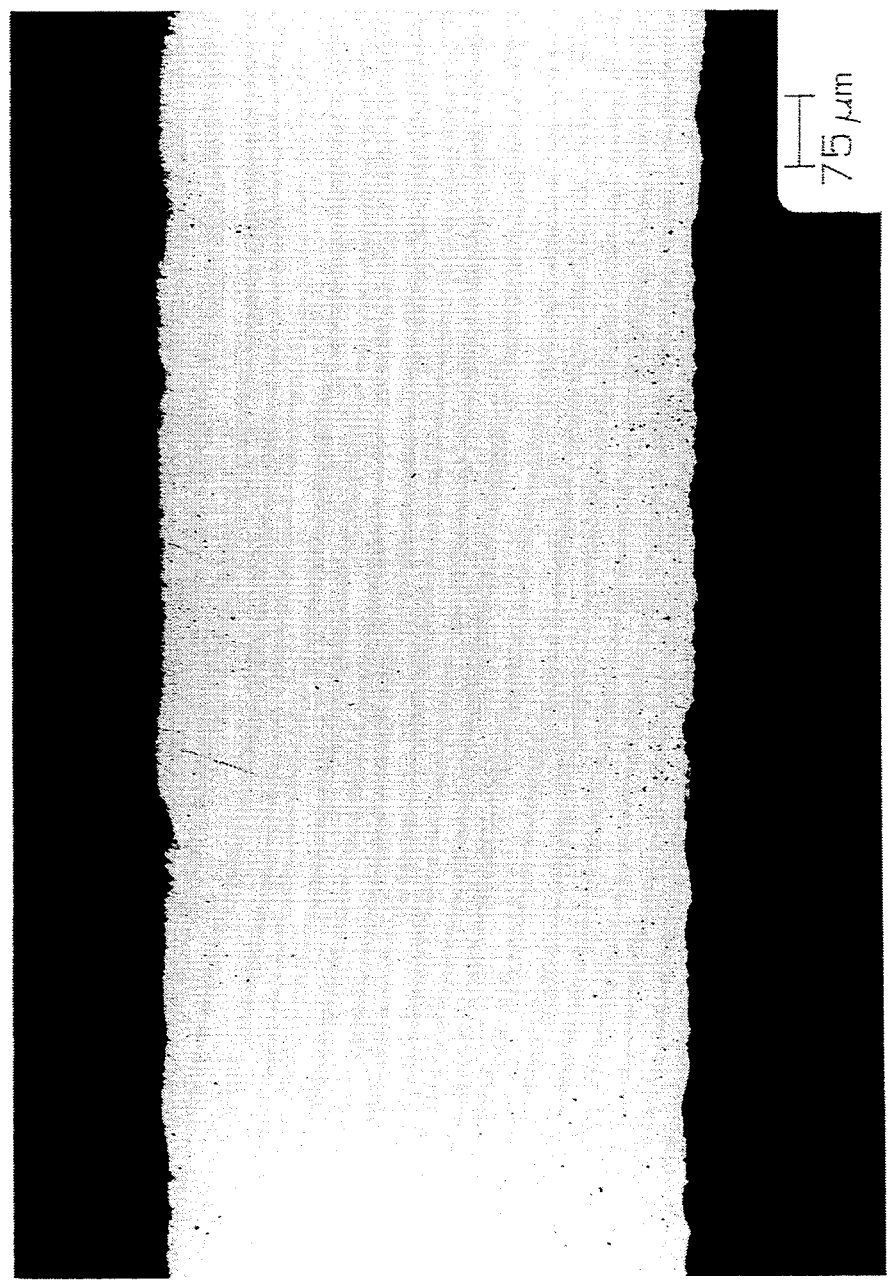
FIG. 5 is a photomicrograph of the surface of a polished cross section of a CVD diamond film having a grain size of less than 1 $\mu$m consistent with the diamond workpieces of the present invention at 125x magnification.
Figure 6:
FIG. 6 is a photomicrograph of the surface of a polished cross section of the CVD diamond film of FIG. 4 at 1250x magnification.

This is apparent from FIGS. 5 and 6, which show a polished cross section of a diamond film which is about 0.8 mm thick and presents a totally homogeneous appearance both at 125X and at 1250X magnifications.

To form the diamond workpieces of the present invention, any conventional substrate material suitable for the production of such workpieces by CVD diamond may be employed. The substrate material may be a metal, metal carbide, metal nitride, ceramic, etc., e.g., silicone carbide, tungsten carbide, molybdenum, boron, boron nitride, niobium, graphite, copper, aluminum nitride, silver, iron, steel, nickel, silicon, alumina, and silica for the formation of mixing tubes, air/abrasive nozzles, and water jet nozzles, the substrate is typically a wire or tube upon which CVD diamond is uniformly grown. The diamond film may separate spontaneously from the substrate upon cooling from the deposition temperature where the substrate, for example, niobium or molybdenum, has a thermal coefficient of expansion which is significantly different from the diamond film deposited thereon. The substrate can also be removed from the diamond coating by conventional methods such as acid leaching. The nature of the substrate is determined by the products desired. Typically, the substrate is of a thickness less than the diamond grown thereon.

Figure 3:
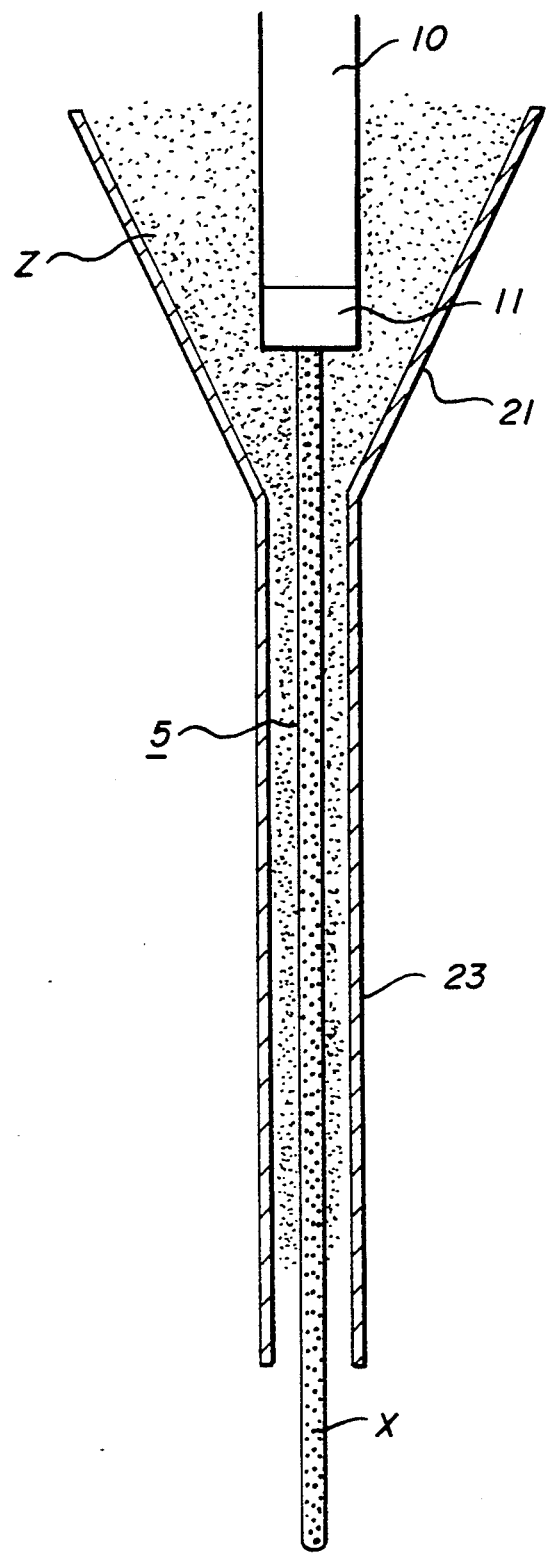
FIG. 3 is a schematic representation of a high pressure water jet mixing tube within the scope of this invention together with a water jet.

The CVD diamond workpieces of this invention are surprisingly superior in the end-use environment because they lack the surface flaws normally present, for example, cracks created by ingrown stresses, random grain size, and voids created by diamond grain pull-out when the surface is polished. An example of a diamond workpiece within the scope of this invention which is subject to severe abrasion is a water jet mixing tube. These tubes comprise a funnel into which abrasive particles are supplied, which is affixed to a tube as a neck thereof. The funnel coaxially surrounds a water jet which ejects water at high pressure axially down the tube. An example of such a mixing tube is shown in FIG. 3, wherein water jet 10 spews a stream of water through water jet nozzle 11 to mix with the abrasives in mixing tube 5, which comprises funnel section 21 and tube section 23. Abrasive particles Z and a stream of water X are shown in FIG. 3 to illustrate the operation of the mixing tube. These elements are not part of the invention. The mixing tube may be comprised entirely of diamond, or it may comprise a steel tube which supports a diamond film.

Figure 2:
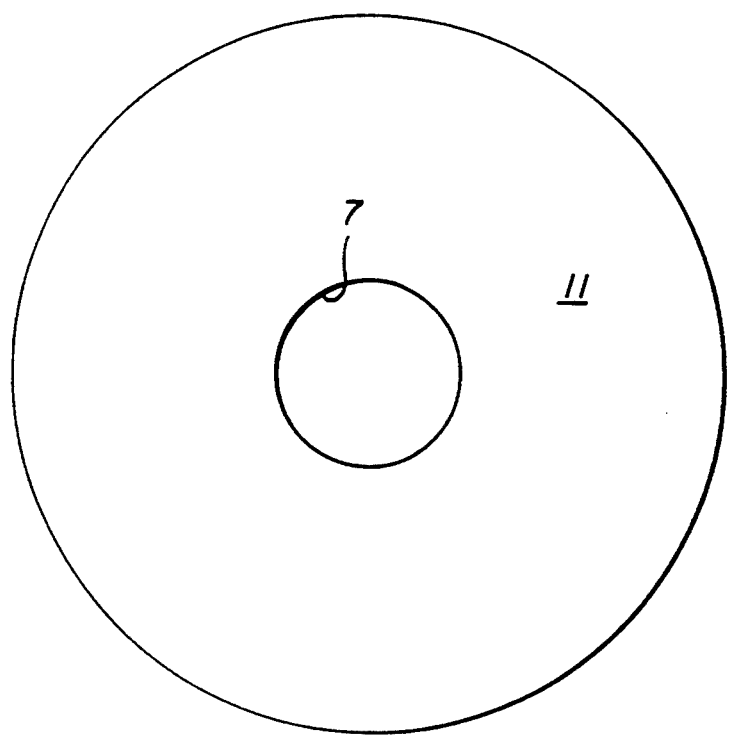

FIGS. 1 and 2 illustrate a water jet nozzle of a high pressure water jet within the scope of this invention. Water jet nozzle 11 directs a jet of water at high pressure through an orifice 7. A stream of water is shown in FIG. 1 as "X" for illustrative purposes only and does not form part of this invention. To produce a symmetrically stable jet stream that can travel 6" before it breaks up as a result of Rayleigh instability, the interior circular peripheral edge of the orifice 7 on interior side 9, around which the stream of water passes under high pressure as it is shaped into a precisely defined stream, must have a sharply curved surface, for example, 1–3 $\mu$m, and include an angle within 3° of a right angle and must not be out of round more than 0.2%. The highly wear-resistant nozzles of the present invention can be formed completely of diamond, or they can comprise a diamond film supported on steel or similar metal. When just a film is utilized, it is preferable to grow the diamond film thereon directly.

Where the diamond workpieces of this invention comprise a supported film, the thickness of the diamond films produced range from about 5–2000 $\mu$m. Because films with smooth growth surfaces become more difficult to produce conventionally as the thickness thereof increases, the self-supporting films have been limited in thickness to less than 2 mm. The diamond workpieces of the present invention are not so limited, but thicknesses in the range of 150–2000 $\mu$m are preferred.

Except for the nitrogen therein, conventional reactive gas mixtures and process conditions are suitable for producing the diamond workpieces of this invention. For example, suitable gaseous hydrogen and hydrocarbon mixtures contain, e.g., 0.1 vol % to 10.0 vol %, preferably from 0.5 vol % to 2.0 vol %, hydrocarbon and from 0.1 vol % to 10.0 vol %, preferably 0.5 vol % to 7.0 vol %, nitrogen, with the remaining 90 vol % to 99.8 vol %, for example, 91–99.5 vol %, being hydrogen. Suitable hydrocarbon sources can include alkane series gases, such as, for example, methane, ethane, and propane, and unsaturated hydrocarbons, for example, ethylene, acetylene, cyclohexene, benzene, and the like. Methane, however, is preferred. The molar ratio of the hydrocarbon to hydrogen broadly ranges from about 1:10 to about 1:1000, with 1:200 to 3:200 being preferred.

The reactive gas mixture employed to produce the diamond workpieces of this invention contain an amount of nitrogen effective to inhibit diamond growth on the diamond grains deposited on the substrate. Typically, only a small amount of nitrogen therein is required, for example, up to about 10 vol %, preferably 0.5–7.0 vol %. Good results are achieved with gas mixtures containing 4–6 vol % nitrogen. It is particularly advantageous to utilize nitrogen concentrations which provide for the growth of diamond films having a grain size of less than 1 $\mu$m. Another beneficial effect of the presence of nitrogen in the reactive gas mixture is that it keeps the walls of the reaction chamber clean during the diamond growth run. Normally, some deposits form on the walls of the quartz tube chamber during a long run and must be cleaned after a number of runs, or the tube becomes opaque.

Contemplated equivalents to utilizing nitrogen are methods wherein a portion or all of the nitrogen is replaced by a functionally equivalent gas, for example, ammonia or hydrogen cyanide. The reactive gas mixture may optionally be diluted with an inert gas such as argon, neon, xenon, and/or helium. Pressures for the reactive gas mixture generally range from about 0.01–1000 Torr, advantageously about 1–760 Torr, and preferably about 10 Torr. Details on conventional process conditions suitable for use can also be found in Angus et al, "Low Pressure Metastable Growth of Diamond and Diamondlike Phases," *Science* 241, 913–921 (Aug. 19, 1988). U.S. Pat. No. 4,707,384 provides further details concerning CVD conditions and techniques.

The reactive gas mixture of hydrogen, nitrogen, and hydrocarbon (most often methane) is preferably "energized" or excited, utilizing conventional techniques, preferably by passing the reactive gas over a hot filament at a conventional temperature, preferably in the range of 1700°–2400° C. Once energized, the excited reactive gas mixture is contacted with the surface of the substrate to be coated with diamond film.

The substrate is desirably heated to a conventional temperature. The substrate temperature utilized for diamond growth typically ranges from 500°–1100° C. and preferably is in the range of 850°–950° C. It is often desirable to maintain the substrate at temperatures in the range of about 900°–1000° C. since, within this range, minimum reaction occurs between the hydrogen present in the gas mixture and the elemental carbon formed from the hydrocarbon therein. Thus, elemental carbon remains available to deposit as diamond at a high growth rate on the substrate. Without controlling substrate temperature, the temperature value can exceed 1000° C., and the diamond growth rate will decrease substantially. Growth rates in the range of about 0.1–10 μm per hour have easily been obtained at energy requirements of about 650 watts/hour. Growth rates greater than 10 μm/hour can be obtained at higher energy costs.

The substrate employed in producing the diamond film is dependent upon the nature of the diamond workpiece to be produced. If the substrate is to form an integral part of the diamond workpiece, such as providing structural support for the diamond film of a mixing tube, its shape and composition is determined by the end use intended for the diamond workpiece. Where the substrate is to be separated from the diamond, materials which provide for easy separation of the diamond film are desired. Niobium is one example of a material which provides for easy separation of the diamond workpiece. When the substrate employed is to be removed, it typically has a thickness in the range of 0.05–2.54 cm, preferably about 0.15–0.65 cm. The surface area of the substrate can vary widely, for example, from 0.65 cm² to 16,000 cm² One or both sides of the substrate are adapted to be exposed to heat and to a reactive gas mixture so as to grow diamond thereon. For example, the surface on which the diamond film is grown is preferably polished so as to allow easy removal of the diamond film formed thereon. Suitable materials are those described above.

Apparatus suitable for producing the diamond workpieces of this invention utilize a substrate as described above. These apparatus comprise a reaction chamber which is airtight and capable of being maintained under reduced pressure. It is fitted with at least one inlet into which a stream of a reactive gas mixture is fed and exhaust means to withdraw a stream of spent reactive gas mixture. All portions of the reaction chamber can be of a conventional design and construction. Quartz is illustrative of a suitable non-conductive, heat-resistant material of which to form the chamber.

A substrate employed in producing the diamond workpieces of this invention is positioned in the reaction chamber by a support means, which can be a spring-tensioned mechanism which maintains the substrate rigidly positioned.

The apparatus can also comprise heating means for heating the growth side of the substrate which preferably is an electrode and a vertically extending, linear, electrically conductive filament or wire (hereinafter generically designated "filament") or otherwise conventional design and circuitry. The material of which the filament is formed is not critical, any material known in the art as suitable for this purpose is acceptable. Illustrative materials are metallic tungsten, tantalum, molybdenum, and rhenium, which can be heated to temperatures of between 1700°–2200° C. Because of its relatively low cost and particular suitability, tungsten is often preferred. Filament diameters of about 0.017–1 cm are typical, with about 0.076 cm frequently being preferred. The filament(s) is positioned on the growth side parallel to the substrate. The distance from the filament to the substrate generally is about 0.2–2 cm. When more than one filament is employed, they are preferably separated by a spacing equal to the filament-to-substrate spacing from each other. A radiation shield, preferably 7.6 cm in diameter, may be placed around the substrate/filament arrangement. Since a plurality of filaments can be employed, preferably two on each side of the substrate surface to be coated with the diamond film and associated structures, it is to be understood that the total number thereof is not critical. The apparatus also includes means for contacting the sides of the substrate to be coated with a reactive gas mixture. This may not require an additional structural element if the substrate is positioned appropriately within the reaction chamber.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following examples, all temperatures are set forth in degrees Celsius; and, unless otherwise indicated, all parts and percentages are by weight.

The entire disclosure of all applications, patents and publications, cited herein, are hereby incorporated by reference.

EXAMPLE

Figure 4:
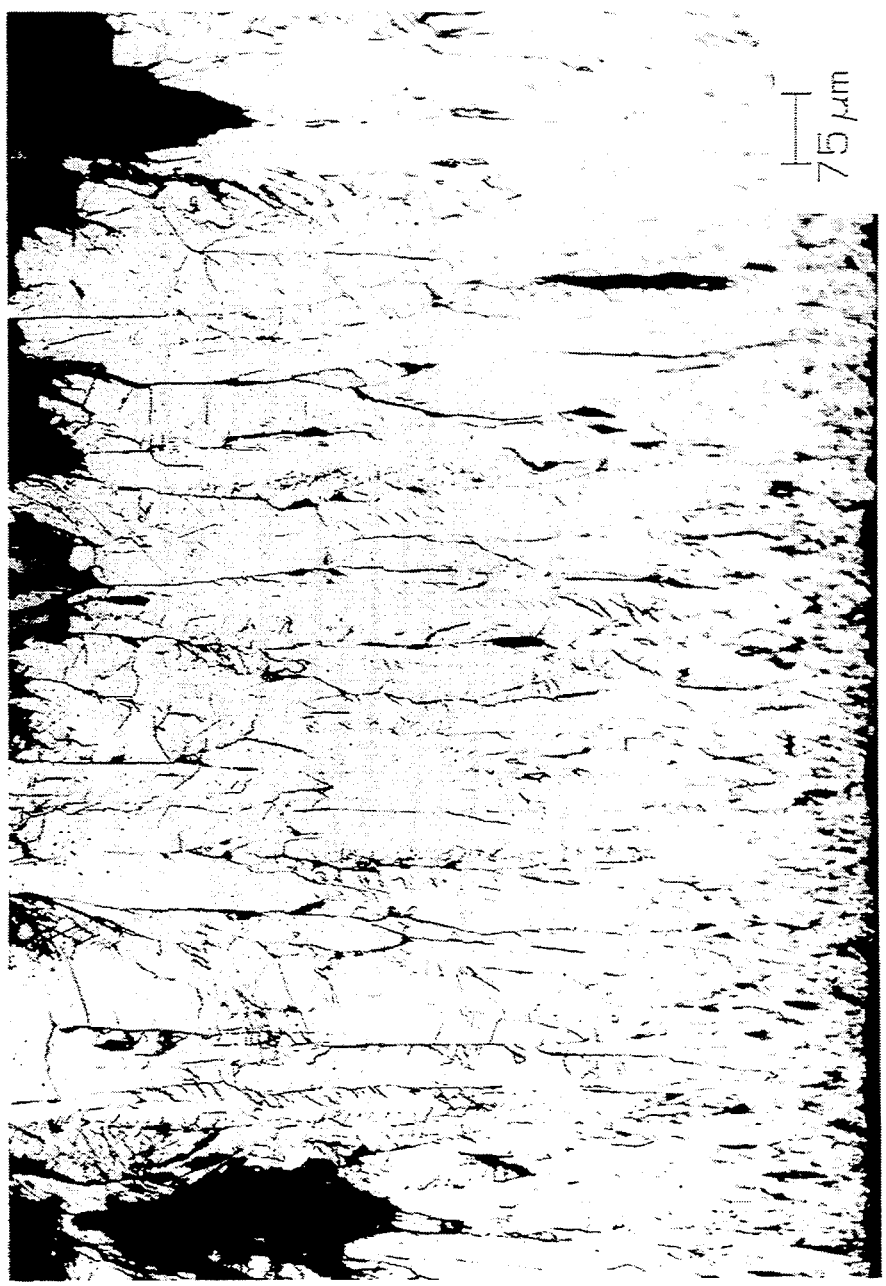
FIG. 4 is a photomicrograph of the surface of a polished cross section of a conventional CVD diamond film having a grain size ranging from 10–70 $\mu$m at 125x magnification.

To illustrate the superior performance of the diamond workpieces with a grain size of less than 1 μm, test samples of diamond films were prepared and exposed to a simulation of the impact and abrasive wear experienced by diamond workpieces, such as abrasive water jets or mixing tubes. Films of about 400–450 μm thickness on a molybdenum substrate were abraded with a silicon carbide grinding wheel to simulate the impact and abrasive wear of diamond workpieces in use. A film of conventional CVD diamond with a grain size ranging from 10–80 μm was tested and compared to a film of diamond representing the present invention with a grain size of less than 1 μm. Upon treatment, photomicrographs of a cross section of the films were obtained, examples of which are shown in FIGS. 4–6. Photomicrographs of a film representing the present invention (FIGS. 5 and 6) show no significant cracks and no significant grain pull-out. In contrast, the photomicrograph of a film representing conventional CVD diamond (FIG. 4) shows multiple cracks and grain pull-out.

Experimental

To form the CVD diamond film with a grain size of less than 1 μm, a procedure similar to the following was utilized:

A CVD reactor designed to accept the substrate described below is used. The CVD reactor comprised a quartz reaction chamber, a gas inlet, and an exhaust outlet. The substrate is a 3.2×28 cm of molybdenum having a 0.32 cm thickness. The substrate is exposed to a 0.076 cm diameter 218 tungsten filament positioned at a distance of about 7 mm from the surface of the substrate.

The chamber is evacuated and the filament heated to bright-white heat (about 2000° C.), heating the surface of the substrate to a temperature of from 800°–1000° C. A reactive gas mixture consisting of about 0.3 vol % methane, 5 vol % nitrogen, and 93.3 vol % hydrogen is introduced into the chamber at about 10 Torr at a flow rate of about 300 cm³/minute. Passage of the gas mixture and heating of the substrate is continued for about 51 days, which results in diamond growth on the surface of the substrate facing the filament. The growth rate of the diamond is about 0.4 μm/hour, which produces a film 21 mils thick in the 51-day period. Because of the three-dimensional convergent diffusion with deposition of mixing tube mandrels, the deposition rate on mixing tubes is expected to be about 1.4 μm/hour under similar operating conditions. At the end of the 51-day period, the gaseous flow is stopped, and the system is cooled. A composite in the form of a diamond film is removed from the reactor. The thickness of each diamond coating is about 21 mils (425 μm). Raman spectra of sample diamond coating shows no signature line at 1332 cm$^{-1}$ and no graphite peak. X-ray diffraction of the same film shows the film comprises cubic diamond. X-ray analysis shows the film contains some nitrogen.

The preceding process and example can be repeated with similar success in forming diamond workpieces of the present invention by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

We claim:

1. A diamond workpiece with a tubular configuration which varies in three dimensions comprised of a homogeneous self supporting single layer of polycrystalline CVD diamond having a grain size of less than 1 μm and a thickness in the range of 150 to 2000 μm wherein said single layer of polycrystalline diamond has no Raman signature at 1332 cm$^{-1}$.

2. A diamond workpiece as in claim 1 selected from the group consisting of a high pressure water jet mixing tube, a high pressure water jet nozzle, and a high pressure air/abrasive jet nozzle.

3. A high pressure water jet nozzle as in claim 2, said water jet nozzle having an interior surface defining an aperture, said surface having an inner edge around said aperture wherein said inner edge of the nozzle being polished to provide a radius of curvature of 1–3 μm and having an included angle is within 3 degrees of a 90° angle.

4. A high pressure water jet nozzle as in claim 3, wherein the aperture is not out of round by more than 0.2% subsequent to polishing.

* * * * *